United States Patent [19]

Crivello

[11] 4,273,668

[45] Jun. 16, 1981

[54] ARYLSULFONIUM SALT-SOLVENT MIXTURES

[75] Inventor: James V. Crivello, Clifton Park, N.Y.

[73] Assignee: General Electric Company, Schenectady, N.Y.

[21] Appl. No.: 49,296

[22] Filed: Jun. 18, 1979

Related U.S. Application Data

[60] Continuation-in-part of Ser. No. 833,146, Sep. 14, 1977, Pat. No. 4,161,478, which is a continuation-in-part of Ser. No. 789,419, Apr. 21, 1977, Pat. No. 4,136,102, which is a division of Ser. No. 574,006, May 2, 1975, which is a continuation-in-part of Ser. No. 466,374, May 2, 1974, abandoned, Ser. No. 466,375, May 2, 1974, abandoned, and Ser. No. 466,378, May 2, 1974, abandoned.

[51] Int. Cl.³ .................... B01J 31/12; G03C 1/68
[52] U.S. Cl. .................... 252/182; 252/431 R; 252/431 P
[58] Field of Search .................... 260/239 R, 333, 440, 260/444, 607 B, 607 R, 441; 204/159.14, 159.18, 159.24; 96/115 R, 115 P, 35.1; 252/182, 431 R, 431 P, 467

[56] References Cited

U.S. PATENT DOCUMENTS

| | | | |
|---|---|---|---|
| 3,305,527 | 2/1967 | Price | 525/382 |
| 3,542,828 | 11/1970 | Harris | 260/446 |
| 3,794,576 | 2/1974 | Wah | 204/159.11 |
| 4,058,400 | 11/1977 | Crivello | 260/440 |
| 4,080,274 | 3/1978 | Schlesinger | 204/159.18 |
| 4,154,872 | 5/1979 | Tsao | 427/44 |
| 4,156,035 | 5/1979 | Tsao | 427/44 |

OTHER PUBLICATIONS

Olah et al. "Friedel–Crafts Chemistry", *J. Amer. Chem. Soc.*, vol. 92, No. 8 (Apr. 1970), pp. 2562–2564.

*Primary Examiner*—Deborah L. Kyle
*Attorney, Agent, or Firm*—William A. Teoli; James C. Davis, Jr.

[57] ABSTRACT

Onium salts of Group VIa elements which have an $MF_6^-$ anion, where M is selected from P, As and Sb, have been found to be photoactive under ultraviolet light. These onium salts can be incorporated as cationic photoinitiators into a variety of cationically polymerizable materials when used in combination with propylene carbonate as an aryl sulfonium salt solvent mixture.

6 Claims, No Drawings

ARYLSULFONIUM SALT-SOLVENT MIXTURES

This application is a continuation-in-part of my copending application Ser. No. 833,146, filed Sept. 14, 1977, now U.S. Pat. No. 4,161,478 which is a continuation-in-part application of Ser. No. 789,419, filed Apr. 21, 1977, now U.S. Pat. No. 4,136,102, which is a division of copending application Ser. No. 574,006, filed May 2, 1975, which is a continuation-in-part of applications Ser. Nos. 466,374, 466,375 and 466,378, filed concurrently on May 2, 1974, now abandoned, where all of the aforesaid applications are assigned to the same assignee as the present invention.

The present invention relates to onium salt photoinitiators of Group VIa elements having an $MF_6^-$ anion, where M is an element selected from P, As and Sb.

The photoinitiator compositions of the present invention can be used in combination with various photopolymerizable organic materials, such as cyclic ethers, cyclic esters, polyvinyl acetals, epoxy resins, etc., to produce UV curable compositions and heat curable compositions. The photoinitiators of the present invention are included by the formula, $$[(R)_a(R^1)_b(R^2)_cX]^+[MF_6]^- \qquad (1)$$

where R is a monovalent aromatic organic radical, $R^1$ is a monovalent organic aliphatic radical, selected from alkyl, cycloalkyl and derivatives thereof, $R^2$ is a polyvalent organic radical forming a heterocyclic or fused ring structure, selected from aliphatic radicals and aromatic radicals, X is a Group VIa element selected from sulfur and selenium, M is selected from P, As and Sb, a is a whole number equal to 0 to 3 inclusive, b is a whole number equal to 0 to 2 inclusive, c is a whole number equal to 0 or 1 and the sum of $a+b+c$ is equal to 3 or the valence of X.

Radicals included by R can be the same or different aromatic carbocyclic or heterocyclic radicals having from 4-20 carbon atoms which can be substituted with from 1 to 4 monovalent radicals selected from $C_{(1-8)}$ alkoxy, $C_{(1-8)}$ alkyl, nitro, chloro, etc. R is more particularly phenyl, chlorophenyl, nitrophenyl, methoxyphenyl, pyridyl, etc. $R^1$ radicals include $C_{(1-8)}$ alkyl, such as methyl, ethyl, etc., substituted alkyls, such as $-C_2H_4OCH_3$, $-CH_2COOC_2H_5$, $-CH_2COCH_3$, etc. $R^2$ radicals include such structures as

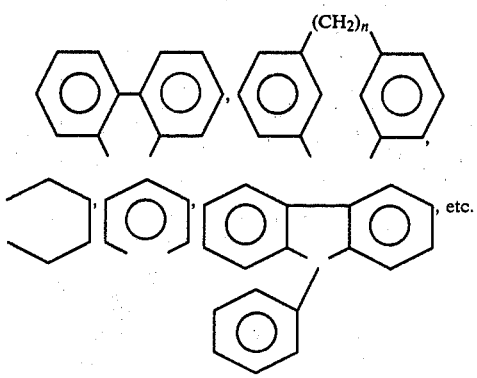

Group VIa onium salts included by formula (1) are, for example,

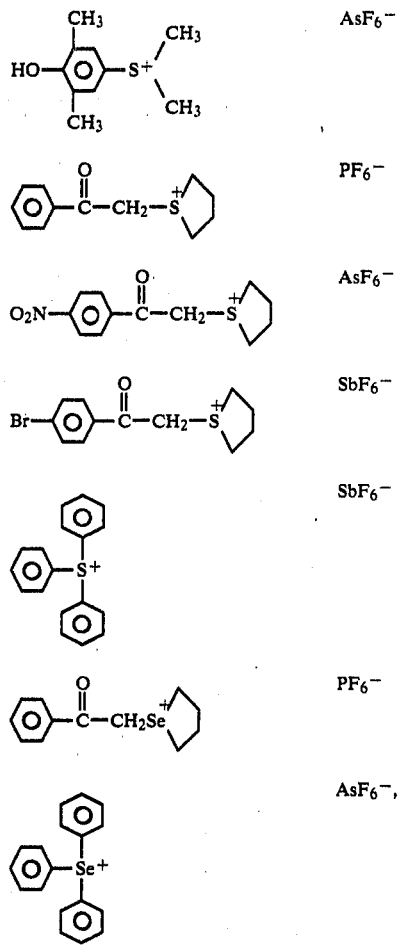

The Group VIa onium salts of formula (1) can be made by procedures shown in application Ser. No. 833,279 of James V. Crivello and Julia H. W. Lam, filed Sept. 14, 1977, now abandoned and assigned to the same assignee as the present invention. An aryl iodonium salt such as diphenyliodonium hexafluoroarsenate is employed with a Group VIa compound, such as diphenylsulfide in the presence of a copper salt catalyst, for example, copper benzoate at temperatures in the range of from 50° C. to 250° C. for one to five hours. Other procedures which can be used are shown in J. W. Knapczyk and W. E. McEwen, J. Am. Chem. Soc., 91 (1969): A. L. Maycock and G. A. Berchtold, J. Org. Chem., 35 No. 8, 2532 (1970); H. M. Pitt, U.S. Pat. No. 2,807,648, E. Goethals and P. De Radzetzky, Bul. Soc. Chim. Belg., 73 546 (1964); H. M. Leicester and F. W. Bergstrom, J. Am. Chem. Soc., 51 3587 (1929), etc.

The Group VIa onium salts of formula (1) can be employed as photoinitiators for effecting the cure of a variety of cationically polymerizable organic materials such as epoxy resins, cyclic ethers, polyvinyl acetals, which are described previously in my application Ser. No. 768,074, filed Feb. 14, 1977, now U.S. Pat. No. 4,102,678, for curing phenol-formaldehyde resins and in my application Ser. No. 732,421, filed Oct. 14, 1976, now abandoned, directed to the use of compounds of formula (1) for curing polyvinyl acetal resins.

In order that those skilled in the art will be better able to practice the present invention, the following examples are given by way of illustration and not by way of limitation. All parts are by weight.

ployed. The following table shows the results obtained.

SULFONIUM SALTS

| Cation Structure | Anion | M.P. (°C.) | λMax (ε Max) | Elemental Analysis | | | |
|---|---|---|---|---|---|---|---|
| HO—⟨C₆H₂(CH₃)₂⟩—S⁺(CH₃)₂ | $AsF_6^-$ | 154–156 | 300(3,000)<br>284(4,100)<br>279(4,600)<br>252(9,300) | calc:<br>found: | C<br>33.20<br>32.99 | H<br>4.15<br>3.90 | S<br>8.75<br>8.92 |
| [HO—⟨C₆H₂(CH₃)₂⟩—]₃S⁺ | $AsF_6^-$ | 245–251 | 263(23,300)<br>280(20,708)<br>317(7,150) | calc:<br>found: | C<br>49.3<br>49.39 | H<br>4.62<br>4.59 | S<br>5.48<br>5.55 |
| (C₆H₅)₃Se⁺ | $AsF_6^-$ | 184–187 | 258(10,900)<br>266 (2,841)<br>275 11 (2,145) | calc:<br>found: | C<br>43.3<br>43.4 | H<br>3.01<br>2.99 | Se<br>15.8<br>16.0 |
| (C₆H₅)₃Se⁺ | $SbF_6^-$ | 140–143 | 258(10,900)<br>266 (2,841)<br>275 (2,145) | calc:<br>found: | C<br>39.6<br>39.9 | H<br>2.75<br>2.98 | |
| C₆H₅—C(O)—CH₂—S⁺⟨⟩ | $PF_6^-$ | 117–1209 | 300 (4,700)<br>248(10,200) | | | | |
| " | $AsF_6^-$ | 161–163 | 300 (4,700)<br>248(10,200) | | | | |
| " | $SbF_6^-$ | 160–163 | 300 (4,700)<br>248(10,200) | | | | |

EXAMPLE 1

Triphenylselenonium chloride was prepared according to the procedure of H. M. Leicester and F. W. Bergstrom, J. Am. Chem. Soc., 51 3587 (1929) starting with diphenyl selenide. The corresponding fluoroborate, hexafluoroarsenate and hexafluoroantimonate salts were prepared by adding sodium hexafluoroarsenate, sodium tetrafluoroborate or potassium hexafluoroantimonate to an aqueous solution of triphenylselenonium chloride. White crystalline solids were obtained which were dried in vacuo.

Three percent solutions of the above salts in 4-vinylcyclohexene dioxide were cured as 2 mil films at a distance of 6 inches from a GE H3T7 lamp. The following cure times were observed:

| Salt | Cure Time |
|---|---|
| $(C_6H_5)_3Se^+BF_4^-$ | 10 sec. |
| $(C_6H_5)_3Se^+AsF_6^-$ | 5 sec. |
| $(C_6H_5)_3Se^+SbF_6^-$ | 3 sec. |

The above results show that the hexafluoro salt is a superior photosensitizer with respect to cure time as compared to the tetrafluoroborate salt.

EXAMPLE 2

Several sulfonium hexafluoroarsenate salts, sulfonium hexafluoroantimonate salts and selenium hexafluoroarsenate salts, were prepared by adding the corresponding anion in the form of the acid or salt, such as sodium hexafluoroarsenate to the corresponding selenonium or sulfonium chloride, such as an aqueous solution of tris(3,5-dimethyl-4-hydroxyphenyl)sulfonium chloride. The procedure described by H. M. Leicester and F. W. Bergstrom, J. Am. Chem. Soc. 51 3587 (1929) was employed.

It was found that 4-vinylcyclohexane dioxide compositions containing the above onium salts exhibited a faster rate of cure, as compared to comparable prior art tetrafluoroborate onium salts.

EXAMPLE 3

A mixture of 11.75 parts of diphenyliodonium hexafluoroarsenate, 4.065 parts of diphenyl sulfide and 0.2 part of copper benzoate was heated with stirring at a temperature of 120°–125° C. for 3 hours. The mixture was then poured while it was hot into a container whereupon the product crystallized. The product was extracted three times with diethylether and then air dried. There was obtained a 97% yield of triphenylsulfonium hexafluoroarsenate. The triphenylsulfonium hexafluoroarsenate product had a melting point of 195°–197° C. after it was further recrystallized from 95% ethanol.

A mixture of 0.02 mole solution of the triphenylsulfonium hexafluoroarsenate in styrene oxide was irradiated at 25° C. in a glass vial sealed under nitrogen using a 450 watt Hanovia lamp. It was found that the styrene oxide polymerized after 5 minutes. The same procedure was repeated, except that there was used tetrahydrofuran.

EXAMPLE 4

The procedure of Example 3 was repeated, except that there was used 12.75 parts of diphenyliodonium hexafluoroarsenate, 2.55 parts of pentamethylene sulfide and 0.2 part of copper benzoate. A 60% yield of product, namely, phenyl penta methylenesulfonium hexafluoroarsenate was obtained after the product was recrystallized from methanol.

EXAMPLE 5

A mixture of 12.75 part of 4,4'-diisopropylphenyliodonium hexafluoroarsenate, 5 parts of phenoxanthene and 0.2 part of copper benzoate was heated under nitrogen with stirring at 120°–125° C. for 3 hours. After cooling the product was extracted with diethylether. The remaining oil was dissolved in methylene chloride and passed through a six inch column of alumina. Trituration with ether followed by cooling in an ice bath gave a white product amounting to a 41% yield of 4-isopropylphenylphenoxanthylium hexafluoroarsenate (m.p. 126°–217° C.) having the formula,

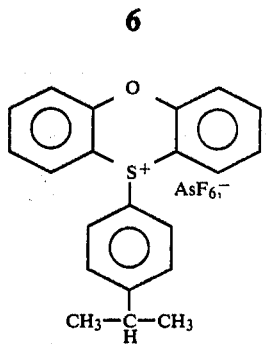

Analysis calc: 49.61; 3.74; 6.30. found: 49.57; 3.82; 6.25.

A 3% solution of the above onium salt in 3,4-epoxycyclohexylmethyl-3',4'-epoxycyclohexane carboxylate was irradiated with a G.E. H3T7 lamp at a distance of 10 inches. A hard tack-free film was obtained in 30 seconds.

EXAMPLE 6

Following the procedure of Examples 3 and 5, additional Group VIa onium salts of formula (1) were prepared as shown in Table I as follows:

TABLE I

| I+ Salt | Group VIa Compound | VIa Salt | Yield (%) | M.P. (°C.) | Analysis | %C | %H | %S |
|---|---|---|---|---|---|---|---|---|
| | | | 97 | 195–197 | calc | 47.7 | 3.3 | 7.06 |
| | | | | | fnd | 47.78 | 3.41 | 7.06 |
| | | | 92 | 133–136 | calc | 56.90 | 4.06 | 6.90 |
| | | | | | fnd | 57.05 | 5.03 | 7.09 |
| | | | 88 | 151–152 | calc | 51.01 | 4.25 | 6.48 |
| | | | | | fnd | 51.05 | 4.34 | 6.44 |
| | | | 87 | 120–125 | calc | 54.0 | 4.0 | 7.6 |
| | | | | | fnd | 54.2 | 4.1 | 7.7 |
| | | | 100 | 120–125 | calc | 50.0 | 3.9 | 6.7 |
| | | | | | fnd | 49.8 | 3.9 | 6.7 |
| | | | 89 | 143–145 | calc | 51.0 | 4.0 | 6.8 |
| | | | | | fnd | 51.2 | 4.1 | 6.8 |
| | | | 79 | 165–168 | calc | 46.3 | 2.8 | 6.9 |
| | | | | | fnd | 46.2 | 2.8 | 7.0 |
| | | | 41 | 126–127 | calc | 49.1 | 3.74 | 6.30 |
| | | | | | fnd | 49.51 | 3.82 | 6.25 |
| | | | 95 | 165–167 | calc | 50.2 | 3.6 | 6.7 |
| | | | | | fnd | 50.25 | 3.6 | 6.67 |

TABLE I-continued

| I+ Salt | Group VIa Compound | VIa Salt | Yield (%) | M.P. (°C.) | Analysis %C %H %S |
|---|---|---|---|---|---|
| [Cl—⌬—I+AsF6−]2 | (dibenzo-dioxin-thia structure) | (S+ aryl AsF6−) | 99 | 183–187 | calc 43.2 2.4 6.4<br>fnd 43.1 2.5 6.3 |
| [—⌬—I+AsF6−]2 | (thioxanthene-like) | (S+ aryl AsF6−, t-Bu) | 67 | 182–185 | calc 53.1 4.4 6.2<br>fnd 53.0 4.6 6.1 |

EXAMPLE 7

In addition to the Group VIa onium salts of Example 6, additional Group VIa salts were prepared following the procedure of Examples 3 and 5 as shown in Table II as follows:

TABLE II

| I+ Salt | Group VIa Compound | VIa Salt | Yield (%) | M.P. (°C.) | Analysis %C %H %S |
|---|---|---|---|---|---|
| [⌬—I+AsF6−]2 | thiane | S+-phenyl AsF6− | 60 | 150–151 | calc 35.87 4.08 8.70<br>fnd 35.69 3.98 8.63 |
| [⌬—I+AsF6−]2 | 1,4-oxathiane | S+-phenyl AsF6− | 67 | 151–153 | calc 32.43 3.51 8.65<br>fnd 32.33 3.53 8.37 |
| [iPr-⌬—I+AsF6−]2 | thiane | S+-phenyl-iPr AsF6− | 56 | 120–125 | calc 40.9 5.1 7.8<br>fnd 40.9 5.1 7.8 |
| [⌬—I+AsF6−]2 | thiolane | S+-phenyl AsF6− | 95 | 110–115 | calc 33.9 3.7 9.0<br>fnd 33.8 3.9 9.2 |
| [⌬—I+AsF6−]2 | Ph—S—CH3 | [⌬—S+—CH3 AsF6−]2 | 97 | 100–102 | calc 40.0 3.33 8.21<br>fnd 38.53 3.39 8.53 |

EXAMPLE 8

In accordance with a further aspect of copending application RD-10107, a variety of triaryl Group VIa onium salts were prepared using a diaryliodonium hexafluoroarsenate, hexafluoroantimonate or hexafluorophosphate salt and a thiophenol coreactant in combination with copper benzoate and triethylamine as a cocatalyst. The diphenyliodonium hexafluoroarsenate was prepared by the procedure shown in Crivello U.S. Pat. No. 3,981,897, assigned to the same assignee as the present invention. Other procedures which can be used are, for example, M. C. Casserio et al., J. Am. Soc., 81 366 (1959). A typical procedure used in preparing such triaryl Group VIa onium salts was as follows:

A mixture of 2.75 part of thiophenol, 11.75 parts of diphenyliodonium hexafluoroarsenate, 0.2 part of copper benzoate and 4 parts of tri-n-butyl amine were heated with stirring at 120°–125° C. under nitrogen for 3 hours. The product after cooling was washed with diethylether and then dried. There was obtained an 86% yield of triphenylsulfonium hexafluoroarsenate. Additional triaryl Group VIa onium salts were prepared as follows following substantially the same procedure:

TABLE III

| I+ Salt | Group VIa Compound | VIa Salt | Yield (%) | M.P. (°C.) |
|---|---|---|---|---|
| $(CH_3-C_6H_4-)_2 I^+ AsF_6^-$ | $CH_3-C_6H_4-SH$ | $(CH_3-C_6H_4-)_3 S^+ AsF_6^-$ | 98 | 164–167 |
| $(C_6H_5-)_2 I^+ AsF_6^-$ | $Cl-C_6H_4-SH$ | $(C_6H_5-)_2 S^+-C_6H_4-Cl\ AsF_6^-$ | 12.1 | 123–127 |
| $(C_6H_5-)_2 I^+ AsF_6^-$ | $F-C_6H_4-SH$ | $(C_6H_5-)_2 S^+-C_6H_4-F\ AsF_6^-$ | 17 | 140–143 |
| $[C_6H_5-]_2 I^+ AsF_6^-$ | $C_6H_5-SH$ | $[C_6H_5-]_3 S^+ AsF_6^-$ | 89 | 194–197 |

In a further aspect of the invention as taught in U.S. Pat. No. 4,058,401, assigned to the same assignee as the present invention, photoinitiators of formula (1), can be used in combination with an organic solvent to form a solution or dispersion of the photoinitiator. Tsao et al U.S. Pat. No. 4,154,872 teaches catalytic solutions of sulfonium salts, where the solvent mixture contains a polyol having at least two hydroxy groups and a lactone. Belgian Pat. No. 845,746 teaches that the presence of polyols in a mixture of epoxy resin and sulfonium salts can result in a flexibilized cured epoxy resin film.

Watt U.S. Pat. No. 3,794,574 and Schlesinger U.S. Pat. No. 4,080,274 further teach that cationic initiators, for example, aromatic diazonium salts can be used satisfactorily in an organic solvent to facilitate the incorporation of the cationic salt into epoxy resins. However, as taught in U.S. Pat. No. 4,058,401, a stabilizer must be used to minimize decomposition of these aromatic diazonium salts even in the dark. The utility of such aromatic diazonium salt solvent mixtures to facilitate the incorporation of the cationic catalyst in the epoxy resin is therefore severely restricted.

The present invention is based on the discovery that photoinitiators of formula (1) can be incorporated into propylene carbonate or ethylene carbonate to produce non-volatile stable aryl sulfonium salt mixtures comprising from 1% to 75% by weight of aryl sulfonium salt of formula (1) based on the total weight of photoinitiator-propylene carbonate mixture. A surprising feature of the present invention is the further discovery that under conditions of photopolymerization in the presence of epoxy resin, normally unreactive propylene carbonate and ethylene carbonate have been found to copolymerize with the epoxy resin. In addition, the resulting cured epoxy resin film remains substantially unplasticized which is desirable in particular instances.

The following example is given by way of illustration and not by way of limitation. All parts are by weight.

EXAMPLE 9

There were added 59.7 parts of a 50% aqueous solution of triphenylsulfonium chloride and 26 parts of sodium hexafluoroantimonate to 80 parts of propylene carbonate. The resulting sodium chloride was then filtered from the mixture after it was thoroughly stirred. The resulting triphenylsulfonium hexafluoroantimonate salt-propylene carbonate solution contained 50% by weight of the triphenylsulfonium salt. A portion of the above triphenylsulfonium salt solution was placed in a capped vial and kept under atmospheric conditions for a period of 12 months. It was found that the salt solution remained substantially unchanged after the extended shelf period.

Following the same procedure, several additional triphenulsulfonium salt-propylene carbonate solutions are prepared having concentrations of 1% and 50% of solids. The various salt solutions are irradiated under ultraviolet light using a GE H3T7 lamp at a distance of 6 inches for a period of 5 minutes. It is found that the propylene carbonate remains substantially unchanged as the result of the irradiation, establishing that the propylene carbonate is substantially unreactive when irradiated in the presence of the triphenylsulfonium hexafluoroantimonate salt.

A triphenylsulfonium hexafluoroantimonate salt-propylene carbonate mixture is freshly prepared containing 50% by weight of the salt in the mixture. A curable composition is prepared by blending 4 parts of the aforementioned 50% salt-solvent mixture with 96 parts of 3,4-epoxycyclohexylmethyl-3',4'-epoxycyclohexane carboxylate. The final curable composition consists of 2% by weight of the triphenylsulfonium hexafluoroantimonate catalyst, 2% by weight of the propylene carbonate and 96% by weight of epoxy resin.

The mixture is irradiated for 30 seconds under UV light from a GE H3T7 lamp at a distance of 6 inches. The same procedure is repeated except that a curable mixture is prepared containing 2% of the sulfonium salt and 98% of the epoxy resin. The propylene carbonate-free mixture is then irradiated following the same procedure as previously described. A third mixture is also irradiated consisting of 93% by weight of the epoxy resin, 2% by weight of the sulfonium salt and 5% by weight of ethylene glycol.

The pencil hardness of the resulting cured epoxy resin films are then compared to each other to determine the degree of plasticization if any in the respective films. When the film derived from the propylene carbonate containing mixture is compared with the film derived from the curable epoxy resin mixture free of the propylene carbonate, it is found that the propylene carbonate containing film actually has a hardness value higher than the mixture free of propylene carbonate. However, the film derived from the mixture containing 5% by weight of ethylene glycol is found to have a lower pencil hardness value than either.

Although the above examples are directed to only a few of the very many variables, such as additional aryl sulfonium salts, epoxy resins, etc., which can be used, it should be understood that the present invention is directed to the aryl sulfonium salts of formula (1), as shown in the description preceding these examples.

What I claim as new and desire to secure by Letters of the Unites States is:

1. A stable aryl onium salt-solvent mixture comprising
   (A) 1% to 75% by weight of aryl onium salt of the formula, $$[(R)_a(R^1)_b(R^2)_cX]^+[MF_6]^-$$

and
   (B) 99% to 25% by weight of a cyclic carbonate selected from the class consisting of ethylene carbonate and propylene carbonate based on the total weight of (A) and (B), where R is a monovalent aromatic organic radical, $R^1$ is a monovalent organic aliphatic radical, selected from alkyl, cycloalkyl and derivatives thereof, $R^2$ is a polyvalent organic radical forming a heterocyclic or fused ring structure, selected from aliphatic radicals and aromatic radicals, X is a Group VIa element selected from sulfur and selenium, M is selected from P, As and Sb, a is a whole number equal to 0 to 3 inclusive, b is a whole number equal to 0 to 2 inclusive, c is a whole number equal to 0 or 1 and the sum of a+b+c is equal to 3 or the valence of X.

2. A mixture in accordance with claim 1, where the aryl sulfonium salt is a triphenylsulfonium salt.

3. A mixture in accordance with claim 1, where the aryl sulfonium salt is triphenylsulfonium hexafluoroarsenate.

4. A mixture in accordance with claim 1, where the aryl sulfonium salt is triphenylsulfonium hexafluoroantimonate.

5. A mixture in accordance with claim 1, where the aryl sulfonium salt is triphenylsulfonium hexafluorophosphate.

6. A mixture in accordance with claim 1, having 50% to 50% by weight of aryl sulfonium salt.

* * * * *